United States Patent [19]

Neely et al.

[11] Patent Number: 5,027,010
[45] Date of Patent: Jun. 25, 1991

[54] TTL OUTPUT DRIVER HAVING AN INCREASED HIGH OUTPUT LEVEL

[75] Inventors: Eric D. Neely, Mesa; Perng Hsyng, Gilbert, both of Ariz.

[73] Assignee: Motorola, Inc., Schaumburg, Ill.

[21] Appl. No.: 417,137

[22] Filed: Oct. 4, 1989

[51] Int. Cl.⁵ .............. H03K 19/088; H03K 19/02; H03K 5/08
[52] U.S. Cl. .................................. 307/456; 307/473; 307/540; 307/546; 307/555
[58] Field of Search ............. 307/443, 454, 456, 473, 307/540, 546, 555, 270

[56] References Cited

U.S. PATENT DOCUMENTS 4,703,202 10/1987 Enomoto et al. ............... 307/456

Primary Examiner—Stanley D. Miller
Assistant Examiner—Margaret Rose Wambach
Attorney, Agent, or Firm—Michael D. Bingham; Robert D. Atkins

[57] ABSTRACT

A TTL output driver is provided which increases the high level of the output signal thereof. The first and second emitters of a first transistor are coupled to the collector and base of a second transistor, respectively, the emitter and collector of which are coupled to the output of the TTL output driver and through a series combination of diode and resistor to a source of operating potential respectively. The output voltage is increased by reducing the base current drive of the first transistor required to achieve the desired output current.

9 Claims, 1 Drawing Sheet

5,027,010

TTL OUTPUT DRIVER HAVING AN INCREASED HIGH OUTPUT LEVEL

BACKGROUND OF THE INVENTION

The invention relates in general to output drivers, and more particularly, to a TTL output driver having an increased high level of the output signal.

The typical TTL output driver comprises a Darlington-coupled transistor pair coupled between a first power supply conductor, $V_{CC}$, and the output of the driver, and a bipolar transistor coupled between the output of the driver and a second power supply conductor, the latter of which operates at ground potential. The Darlington-coupled transistor pair and the bipolar transistor are responsive to first and second complementary control signals applied at the bases thereof. In addition, a diode and resistor are serially coupled between $V_{CC}$ and the Darlington-coupled transistor pair for limiting the current flow therethrough and preventing reverse conduction between the output of the driver and $V_{CC}$. Assuming the first and second control signals are high and low respectively, the Darlington-coupled transistor pair is rendered conductive and the collector-emitter conduction path of the bipolar transistor is high impedance, thereby allowing the output signal to be pulled in a positive direction towards $V_{CC}$.

The industry has established a generally accepted standard for the minimum level of a TTL high signal, that being, approximately 2.4 volts with respect to ground potential. Given the uncertainty in component values associated with the variation in the manufacturing process, it is desirable to maximize the level of the high output signal for providing an adequate margin above the industry standard. However, this margin is difficult to increase in the conventional TTL output driver in view of the commonly known requirements of the TTL output driver, for example, the output drive current over temperature specification (3 milliamps at $-55°$ C.), which inherently opposes a reduction in the potential developed across the aforementioned series diode and resistor in the output conduction path, not to mention the potential across the Darlington transistor pair.

Hence there is a need for an improved TTL output driver for providing an increased margin for the high output signal level.

SUMMARY OF THE INVENTION

It is therefore an objective of the present invention to provide an improved TTL high output driver.

A further objective of the present invention is to provide an improved TTL high output driver having a predetermined high level at the output thereof.

Another objective of the present invention is to provide an improved TTL high output driver for increasing the output drive capability without loss of magnitude of the output voltage.

In accordance with the above and other objectives there is provided an improved TTL output driver circuit comprising a first transistor having an emitter coupled to an output of the circuit, and having a collector and a base; first diode and a first resistor serially coupled between a first source of operating potential and the collector of the first transistor; and a second transistor having a base responsive to an applied first input signal, first emitter coupled to the collector of the first transistor, second emitter coupled to the base of the first transistor and a collector coupled to the source of operating potential.

DETAILED DESCRIPTION OF THE PREFERRED EMBODIMENT

Figure 1:
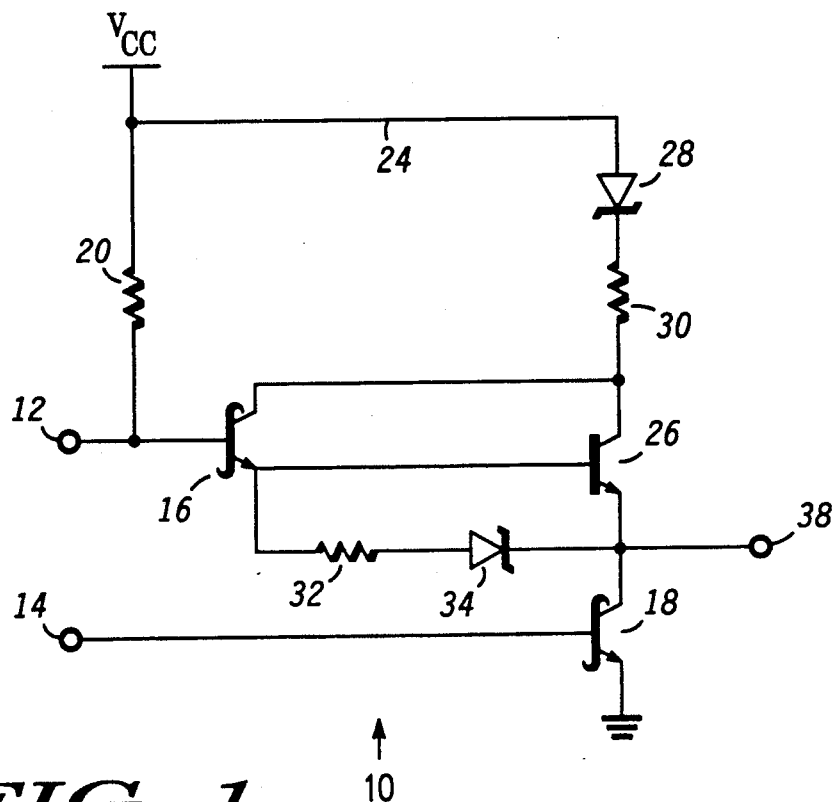
FIG. 1 is a schematic diagram illustrating a conventional TTL output driver.

Referring to FIG. 1, conventional TTL output driver 10 includes inputs 12 and 14 coupled to the bases of transistors 16 and 18 respectively. The base of transistor 16 is coupled through resistor 20 to power supply conductor 24 operating at a positive potential, $V_{CC}$. The collector and emitter of transistor 16 are coupled to the collector and base of transistor 26 respectively. The anode of diode 28 is coupled to power supply conductor 24, while the cathode is coupled through resistor 30 to the collectors of transistors 16 and 26. Resistor 32 and diode 34 are serially coupled between the emitters of transistors 16 and 26 as shown, and the emitter and collector of transistor 18 are respectively coupled to power supply conductor 36 and output 38, the latter of which is provided at the emitter of transistor 26.

During operation, first and second complementary control signals are applied at inputs 12 and 14, respectively. Assuming that the first control signal is high and, accordingly, the second control signal is low, transistor 16 is rendered conductive thereby sourcing emitter current into the base of transistor 26 and turning the latter on. The Darlington configuration of transistors 16 and 26 can provide considerable collector current flowing through the latter due to the multiplication of the forward current gains thereof. Notably, transistor 16 is of a Schottky type operating in clamped state when the first control signal is high. Meanwhile, the low state of the second control signal renders transistor 18 non-conductive such that the collector-emitter conduction path of transistor 18 presents a high impedance at output 38, and thereby allows the voltage at output 38, $V_{38}$, to be pulled toward $V_{CC}$. The magnitude of the voltage $V_{38}$ is then equal to:

$$V_{38} = V_{CC} - I_{20} \cdot R_{20} - V_{16} - V_{26} \tag{1}$$

where:
$I_{20}$ = current flowing through resistor 20
$R_{20}$ = value of resistor 20
$V_{16}$ = base-emitter junction potential, $V_{be}$, of transistor 16
$V_{26} = V_{be}$ of transistor 26

In considering means of increasing voltage $V_{38}$, virtually no improvement can be made in the base-emitter junction potentials of transistors 16 and 26, nor the power supply voltage $V_{CC}$ since the latter is restricted to minimum industry standards, typically 4.5 volts. In addition, the value of resistor 20 is already established at a predetermined minimum value to limit the current flowing into the base of transistor 16 when transistor 18 is conducting. Hence, current $I_{20}$ is the only viable parameter (via a reduction thereof) from which to increase voltage $V_{38}$.

For conventional TTL output driver 10, current $I_{20}$ may be calculated as follows:

$$I_{20} = V_{CC} - (V_{CC} - V_{28} - I_{30} \cdot R_{30} + V_{BC16})/R_{20} \tag{2}$$

where:
$V_{28}$ = potential across diode 28
$I_{30}$ = current flowing through resistor 30
$R_{30}$ = value of resistor 30
$V_{BC16}$ = base-collector junction potential of Schottky-clamped transistor 16
Equation (2) may be reduced to:

$$I_{20} = (V_{28} + I_{30} * R_{30} - V_{BC16})/R_{20} \qquad (3)$$

Examining the components of equation (3) with emphasis upon reducing current $I_{20}$, voltages $V_{28}$ and $V_{BC16}$ are substantially constant and, therefore, offer little promise, and existing value of resistor $R_{30}$ is needed to maintain the output current drive requirement. Hence, a new circuit configuration is needed to achieve the aforedescribed objectives.

Figure 2:
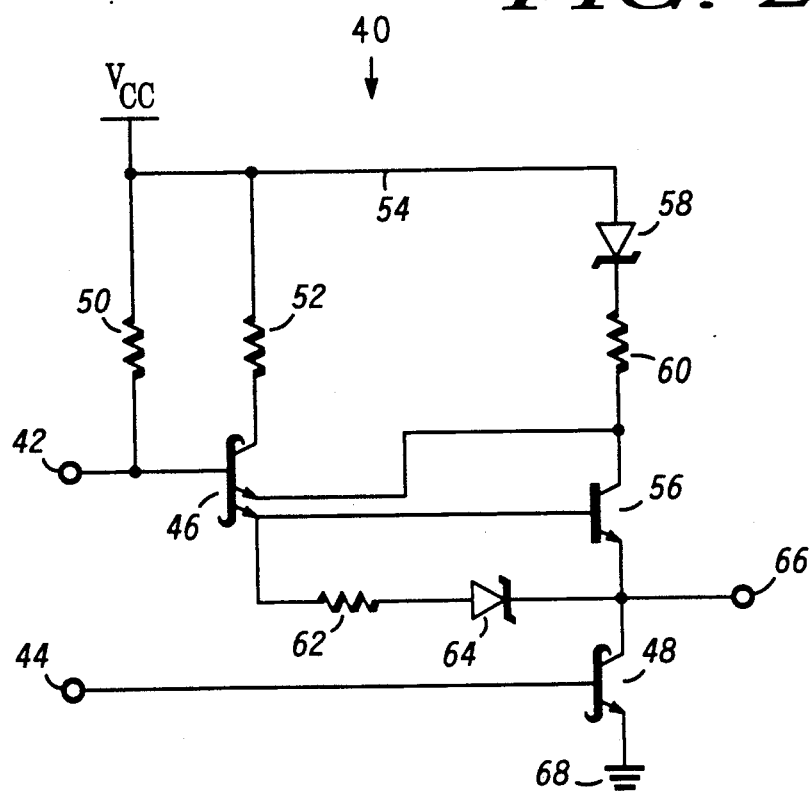
FIG. 2 is a schematic diagram illustrating the preferred embodiment of the present invention.

The preferred embodiment of the present invention is shown in FIG. 2, and comprises TTL output driver 40 having inputs 42 and 44 coupled to the bases of transistors 46 and 48, respectively. The base and collector of transistor 46 are coupled through resistors 50 and 52, respectively to power supply conductor 54, the latter of which operates at $V_{CC}$. Transistor 46 also provides first and second emitters coupled to the collector and base of transistor 56, respectively. Typically, transistors 46 and 48 are of a Schottky type. The anode of diode 58 is coupled to power supply conductor 54, while the cathode is coupled through resistor 60 to the collector of transistor 56. The second emitter of transistor 46 is also coupled through resistor 62 to the anode of diode 64, the cathode of which is coupled to the emitter of transistor 56 at output 66. The collector-emitter conduction path of transistor 48 is then coupled between output 66 and power supply conductor 68. Resistor 62 provides a path to discharge the base of transistor 56 when the first control signal is low, and diode 64 prevents reverse conduction of transistor 46 should output 66 be driven above $V_{CC}$.

Following the initial conditions setforth in the discussion of TTL output driver 10, assume that the first complementary control signal is high and the second control signal is low. The collector-emitter conduction path of transistor 46 is rendered conductive sourcing current through the first and second emitters thereof turning on transistor 56. Meanwhile, the low signal applied at input 44 renders the collector-emitter conduction path of transistor 48 high impedance and thereby allows the voltage of output 66 ($V_{66}$) to be pulled toward $V_{CC}$. The magnitude of voltage $V_{66}$ is then equal to:

$$V_{66} = V_{CC} - I_{50} * R_{50} - V_{46} - V_{56} \qquad (4)$$

where:
$I_{50}$ = current flowing through resistor 50
$R_{50}$ = value of resistor 50
$V_{46}$ = $V_{be}$ of transistor 46
$V_{56}$ = $V_{be}$ of transistor 56

For TTL output driver 40, current $I_{50}$ may be calculated as follows:

$$I_{50} = V_{CC} - (V_{CC} - V_{58} - I_{60} * R_{60} + V_{46})/R_{50} \qquad (5)$$

where:
$V_{58}$ = potential across diode 58
$I_{60}$ = current flowing through resistor 60

$R_{60}$ = value of resistor 60
$V_{46}$ = $V_{be}$ of transistor 46
Equation (5) may be reduced to:

$$I_{50} = (V_{58} + I_{60} * R_{60} - V_{46})/R_{50} \qquad (6)$$

Equations (3) and (6) may now be compared in that the values of voltages $V_{28}$ and $V_{58}$ are equal, and the value of resistor $R_{30}$ is equal to the value of resistor $R_{60}$. The distinction lies in the value of voltage $V_{BC16}$ of equation (3) versus the value of voltage $V_{46}$ of equation (6). It is well known in the art that the base-collector junction potential of a Schottky-clamped bipolar transistor, typically 500 millivolts (mv), is smaller than the base-emitter potential of the same transistor, typically 850 mv. In TTL output driver 40, the voltage at the base of transistor 46 is one base-emitter junction potential above the potential at the collector of transistor 56, as compared to TTL output driver 10 wherein the voltage at the base of transistor 16 is one Schottky diode clamp ($V_{BC16}$) potential above the potential at the collector of transistor 26. Thus, the voltage at the base of transistor 46 is greater than the voltage at the base of transistor 16 for the same magnitude of output current. Hence, the magnitude of current $I_{50}$ is less than the magnitude of current $I_{20}$, and, correspondingly, by equations (1) and (4), voltage $V_{66}$ of TTL output driver 40 is greater than voltage $V_{38}$ of TTL output driver 10.

Another feature of the present invention involves the selection of resistor $R_{52}$ and the ratio of the areas of the first and second emitters of transistor 46. The current drive capability of TTL output driver 40 may be increased without loss of magnitude of voltage $V_{66}$, by reducing the value of resistor $R_{52}$ and apportioning a larger area to the first emitter, thereby increasing the contribution of output drive current attributed to the collector-first emitter conduction path of transistor 46.

Hence, what has been described is a novel output driver including first and second transistors wherein the first and second emitters of the first transistor are coupled to the base and collector of the second transistor, respectively, for providing a TTL compatible output signal having an increased high output level. The output voltage is increased by reducing the base current drive of the first transistor required to achieve the desired output current.

We claim
1. A circuit having an output for providing an increased high level TTL compatible output signal, comprising:
a first transistor having an emitter coupled to the output, and having a collector and a base;
a second transistor having a base, first and second emitters and a collector, said base being responsive to an applied first input signal, said collector being coupled to a first source of operating potential, said first emitter being coupled to said collector of said first transistor, said second emitter being coupled to said base of said first transistor;
a third transistor having a base, an emitter and a collector, said base being responsive to an applied second input signal, said emitter being coupled to a second source of operating potential, said collector being coupled to the output;
first diode means having an anode coupled to said first source of operating potential and having a cathode; and a first resistor coupled between said cathode of said first diode means and said collector of said first transistor.

2. The circuit of claim 1 further comprising:
a second resistor coupled between said first source of operating potential and said base of said second transistor; and
a third resistor coupled between said first source of operating potential and said collector of said second transistor.

3. The circuit of claim 2 further comprising;
second diode means having a cathode coupled to the output of the circuit and having an anode; and
a fourth resistor coupled between said anode of said second diode means and said second emitter of said second transistor.

4. An integrated output driver having an output for providing an increased high level TTL compatible output signal, comprising:
a first transistor having an emitter coupled to the output, and having a collector and a base;
a second transistor having a base, first and second emitters and a collector, said base being responsive to an applied first input signal, said collector being coupled to a first source of operating potential, said first emitter being coupled to said collector of said first transistor, said second emitter being coupled to said base of said first transistor;
a third transistor having a base, an emitter and a collector, said base being responsive to an applied second input signal, said emitter being coupled to a second source of operating potential, said collector being coupled to the output;
first diode means having an anode coupled to said first source of operating potential and having a cathode; and
a first resistor coupled between said cathode of said first diode means and said collector of said first transistor.

5. The output driver of claim 4 further comprising:
a second resistor coupled between said first source of operating potential and said base of said second transistor; and
a third resistor coupled between said first source of operating potential and said collector of said second transistor.

6. The output driver of claim 5 further comprising;
second diode means having a cathode coupled to the output of the circuit and having an anode; and
a fourth resistor coupled between said anode of said second diode means and said second emitter of said second transistor.

7. A TTL output driver circuit including a first transistor having a collector, a base and an emitter coupled to an output of the circuit, the first transistor being responsive to a signal applied at the base for the pulling the output high; first diode means and a first resistor serially coupled between a first source of operating potential and the collector of the first transistor; a second transistor having a base, an emitter coupled to a second source of operating potential and a collector coupled to the output which is responsive to a first input signal applied at said base for pulling the output low; wherein the improvement comprises a third transistor having a base, first and second emitters and a collector, said collector being coupled to the first source of operating potential, said first emitter being coupled to the collector of the first transistor, said second emitter being coupled to the base of the first transistor, said third transistor being responsive to a second input signal applied at said base for providing the signal to the first transistor.

8. The TTL output driver circuit of claim 7 further comprising:
a second resistor coupled between the first source of operating potential and said base of said third transistor; and
a third resistor coupled between the first source of operating potential and said collector of said third transistor.

9. The TTL output driver circuit of claim 8 further comprising;
second diode means having a cathode coupled to the output and having an anode; and
a fourth resistor coupled between said anode of said second diode means and said second emitter of said third transistor.

* * * * *